(12) United States Patent
Kawato et al.

(10) Patent No.: US 10,597,770 B2
(45) Date of Patent: Mar. 24, 2020

(54) VAPOR DEPOSITION SOURCE, VAPOR DEPOSITION APPARATUS AND METHOD FOR PRODUCING VAPOR-DEPOSITED FILM

(71) Applicant: Sharp Kabushiki Kaisha, Sakai, Osaka (JP)

(72) Inventors: Shinichi Kawato, Sakai (JP); Katsuhiro Kikuchi, Sakai (JP); Manabu Niboshi, Sakai (JP); Satoshi Inoue, Sakai (JP); Yuhki Kobayashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 279 days.

(21) Appl. No.: 15/741,296

(22) PCT Filed: Jul. 21, 2016

(86) PCT No.: PCT/JP2016/071397
§ 371 (c)(1),
(2) Date: Jan. 2, 2018

(87) PCT Pub. No.: WO2017/018314
PCT Pub. Date: Feb. 2, 2017

(65) Prior Publication Data
US 2018/0187299 A1      Jul. 5, 2018

(30) Foreign Application Priority Data

Jul. 28, 2015   (JP) .................. 2015-148966

(51) Int. Cl.
*C23C 14/24*   (2006.01)
*H01L 51/00*   (2006.01)

(52) U.S. Cl.
CPC ............ *C23C 14/24* (2013.01); *C23C 14/243* (2013.01); *H01L 51/0008* (2013.01)

(58) Field of Classification Search
None
See application file for complete search history.

(56) References Cited

U.S. PATENT DOCUMENTS

| 6,911,671 B2 * | 6/2005 | Marcus ................. C23C 14/12 257/79 |
| 2003/0168013 A1 | 9/2003 | Freeman et al. |
| 2005/0211172 A1 | 9/2005 | Freeman et al. |
| 2013/0260501 A1 * | 10/2013 | Sonoda ................. C23C 14/12 438/46 |

FOREIGN PATENT DOCUMENTS

| JP | 7-93249 B2 | 10/1995 |
| JP | 2003-297570 A | 10/2003 |

* cited by examiner

*Primary Examiner* — Joel G Horning
(74) *Attorney, Agent, or Firm* — Keating & Bennett, LLP

(57) ABSTRACT

Provided is a line source that can achieve uniform film thickness distribution and also achieve high use efficiency of vapor deposition materials. A line source (10) has slit nozzles (1) having a slit nozzle's length-to-width ratio of 4 to 50, a width of 1 mm to 5 mm, and a depth of 5 mm to 20 mm.

12 Claims, 12 Drawing Sheets

FIG. 3
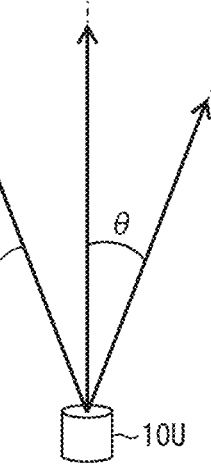
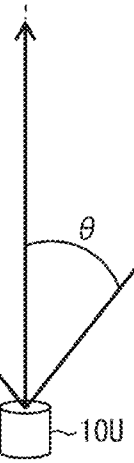

FIG. 4
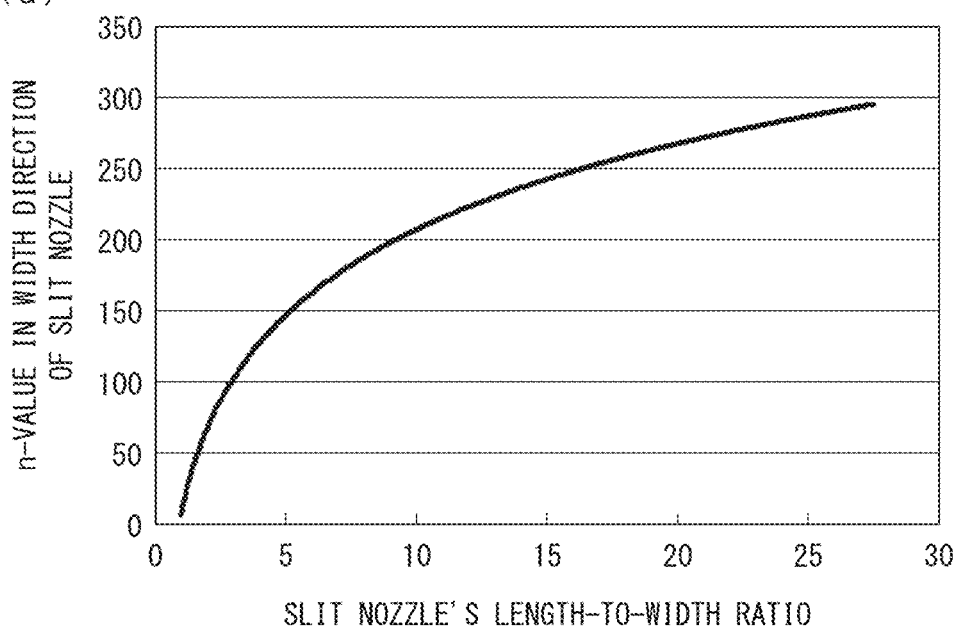
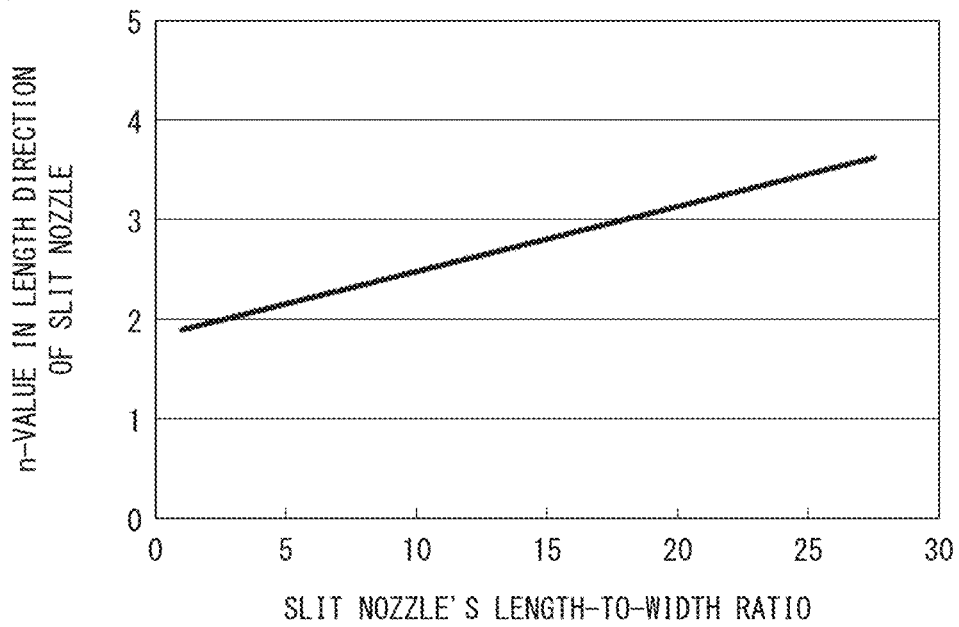

FIG. 6
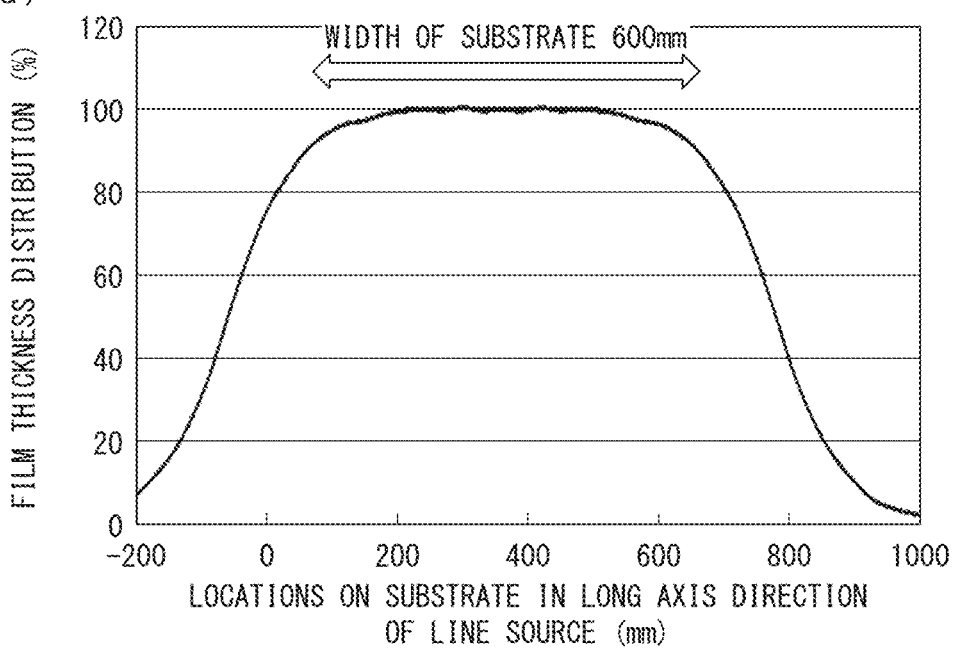
(a)
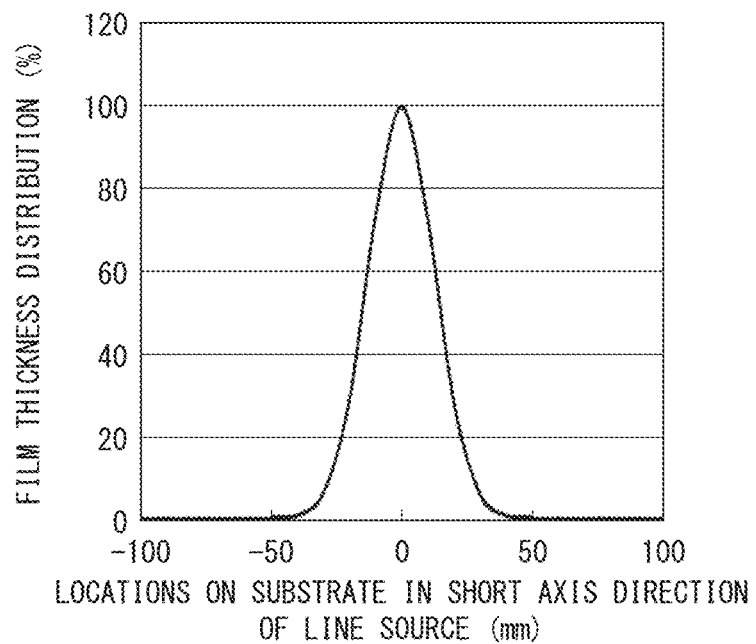
(b)

FIG. 8
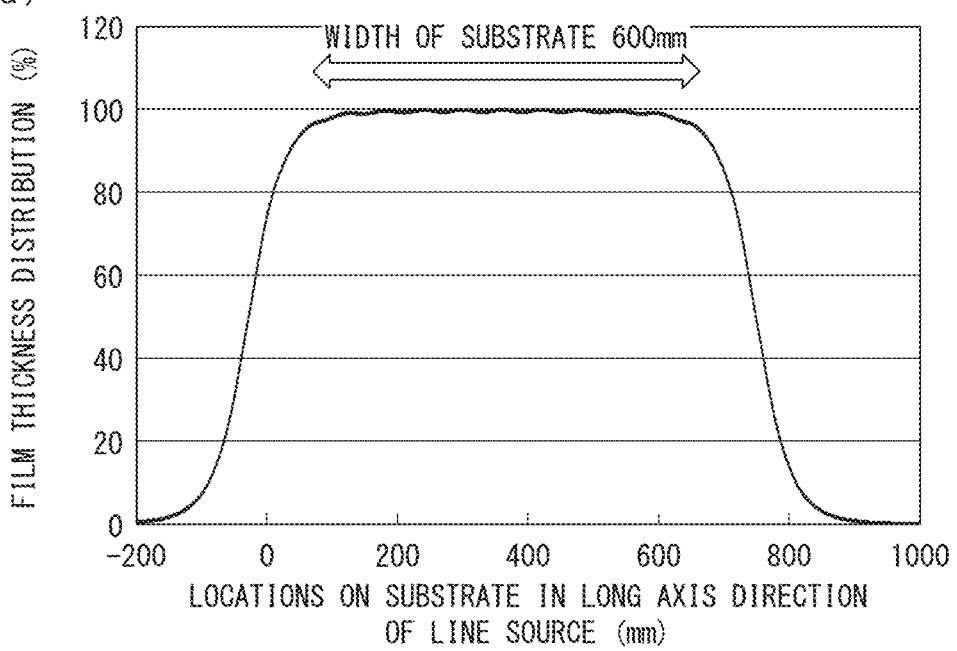
(a)
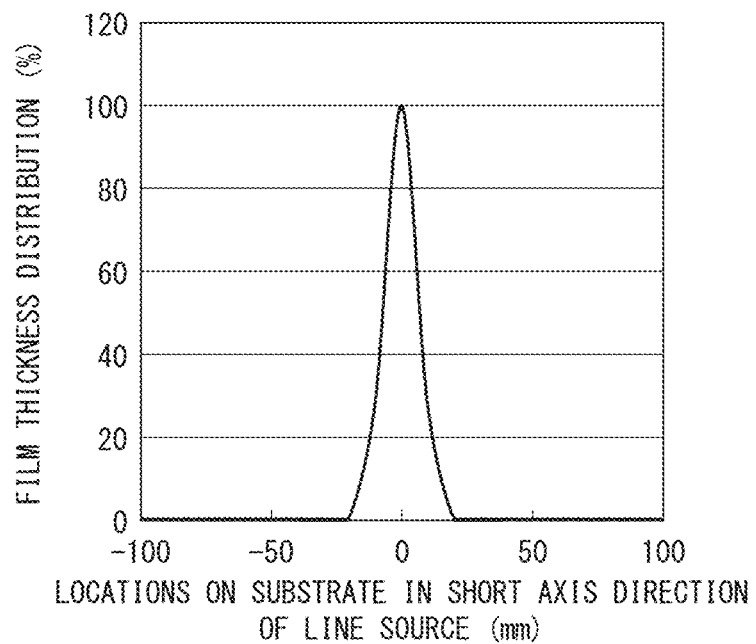
(b)

VAPOR DEPOSITION SOURCE, VAPOR DEPOSITION APPARATUS AND METHOD FOR PRODUCING VAPOR-DEPOSITED FILM

TECHNICAL FIELD

The present invention relates to a vapor deposition source that has holes (hereinafter referred to as nozzles) via which a vapor deposition material is ejected in the form of vapor deposition particles, a vapor deposition device including the vapor deposition source, and a method of forming a vapor-deposited film with the use of the vapor deposition source.

BACKGROUND ART

In recent years, various flat-panel displays have been developed. Organic EL (electroluminescent) display devices, especially, are attracting much attention as excellent flat-panel displays, because these devices can achieve power saving, thickness reduction, increase in resolution, and the like.

In the field of such organic EL display devices, using a larger motherboard is more preferred in order to, for example, obtain a larger display screen and/or reduce production cost. In a case where a film is to be formed by vapor deposition on such a large motherboard having a large area, a vapor deposition source called a "line source" or a "linear source" is used. Such a vapor deposition source has nozzles via which a vapor deposition material is ejected in the form of vapor deposition particles, and these nozzles are arranged along one direction. Therefore, the vapor deposition source is generally longer in a first direction than in a second direction which is orthogonal to the first direction and in which the vapor deposition source or a board (substrate) is moved. A vapor deposition source for use in forming a film by vapor deposition on a large motherboard is hereinafter referred to as a line source.

Figure 10:
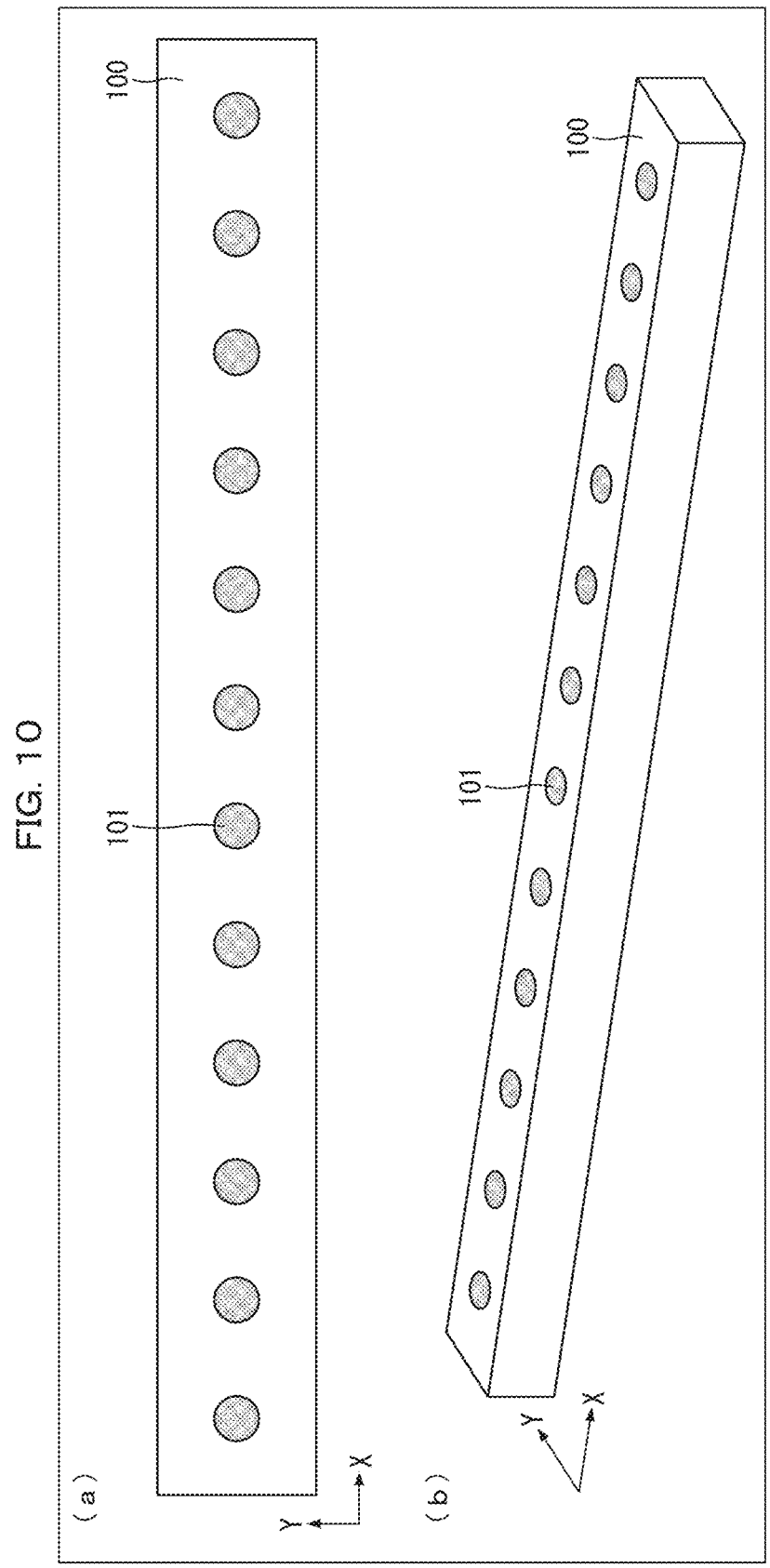

(a) of FIG. 10 is a top view schematically illustrating a shape of a conventional line source, and (b) of FIG. 10 is a perspective view schematically illustrating the shape of the conventional line source.

In forming a film by vapor deposition on a large motherboard, it is very important to carry out the vapor deposition so that the resulting film will have a uniform thickness distribution. To this end, a line source 100 normally has a plurality of circular nozzles 101 via which a vapor deposition material is ejected in the form of vapor deposition particles (see (a) and (b) of FIG. 10).

The line source 100 is configured to be heated and thereby cause a vapor deposition material to be ejected in the form of vapor deposition particles outward through the circular nozzles 101. A method for heating and the like are not particularly limited. There is no particular limitation on a material for the line source 100, but the line source 100 is usually made from a material that is less prone to thermal shrinkage. The shape of the line source 100 is such that the line source 100 is longer in an X direction (shown in (a) and (b) of FIG. 10) than in a Y direction (shown in (a) and (b) of FIG. 10) that is orthogonal to the X direction.

The vapor deposition particles ejected from the circular nozzles 101 in an ejection face of the line source 100 are superposed on a substrate. This enables uniform vapor deposition over a large area.

CITATION LIST

Patent Literature

[Patent Literature 1]
Japanese Patent Application Publication, Tokukai, No. 2003-297570 (publication date: Oct. 17, 2003)
[Patent Literature 2]
Japanese Examined Patent Application Publication, Tokukohei, No. 7-93249 (publication date: Oct. 9, 1995)

SUMMARY OF INVENTION

Technical Problem

However, the use of the conventional line source 100 illustrated in (a) and (b) of FIG. 10 raises an issue of poor use efficiency of the vapor deposition material.

Figure 11:
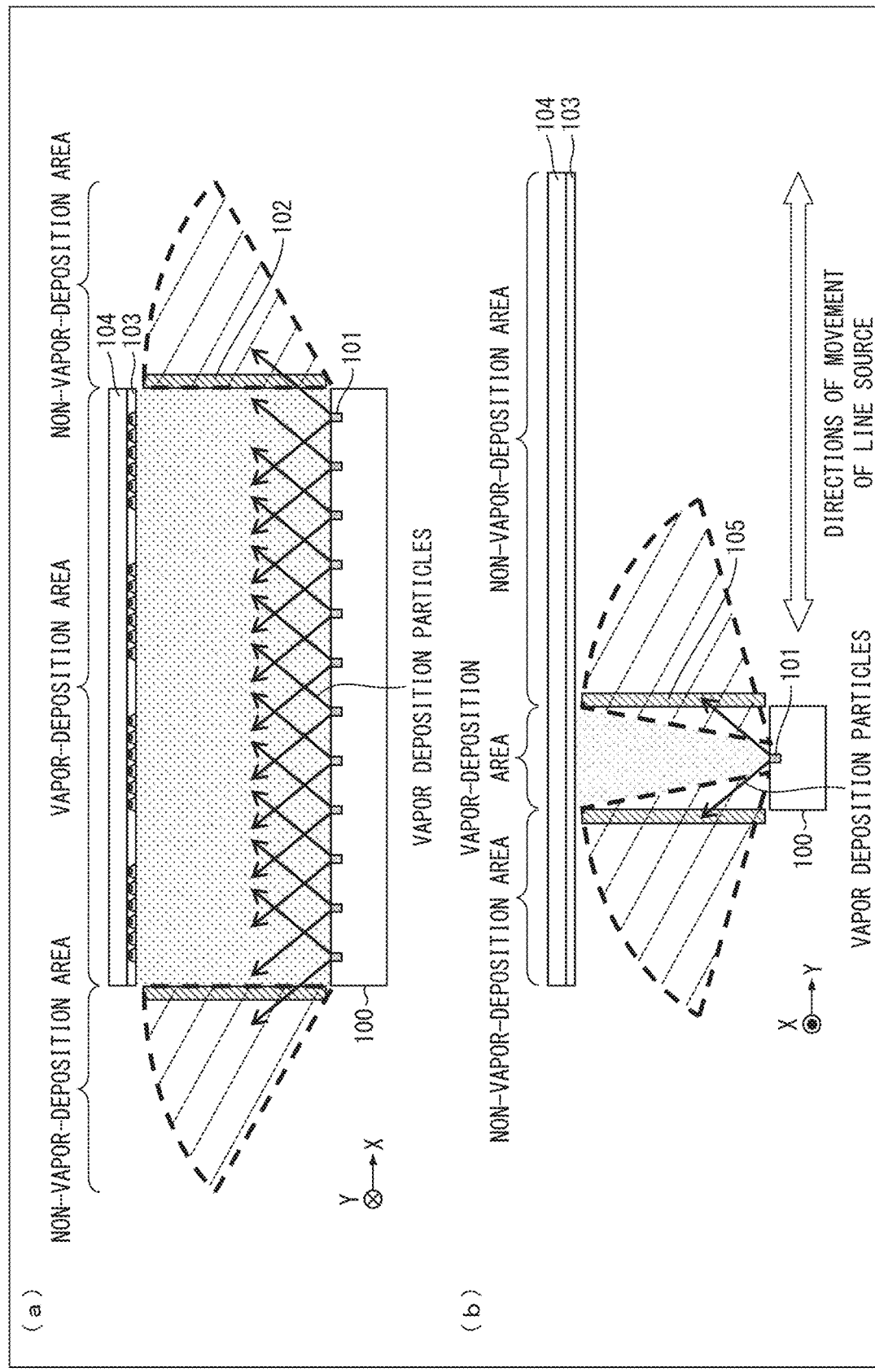

(a) and (b) of FIG. 11 are drawn for explaining why use efficiency of the vapor deposition material is poor in a case where the conventional line source 100 is used.

The conventional line source 100 (see (a) and (b) of FIG. 10) usually has the circular nozzles 101. In a case where nozzles have a circular shape like the circular nozzles 101, vapor deposition particles ejected from each of the circular nozzles 101 widely spread in the X direction as they travel (see (a) of FIG. 11). For the purpose of preventing the vapor deposition particles from spreading to a non-vapor-deposition area where no substrate 104 is present, deposition preventer plates 102 are provided so as to obstruct directions in which the vapor deposition particles may scatter. It is noted that, in a vapor-deposition area where the substrate 104 is present, it is possible to form a vapor-deposited film having a predetermined shape over the entire width of the substrate 104 by causing the vapor deposition particles to deposit on the substrate 104 through a mask 103.

The following will consider the use efficiency of the vapor deposition material in regard to the X direction shown in (a) of FIG. 11. It is clear from (a) of FIG. 11 that, since a length of the line source 100 in a long axis direction of the line source 100 (the X direction in (a) of FIG. 11) is substantially equal to the width of the substrate 104, many of the spread vapor deposition particles reach the vapor-deposition area where the substrate 104 is present and are utilized effectively (that is, a great percentage of the spread vapor deposition particles are utilized effectively). In other words, some of the vapor deposition particles, in particular, some of vapor deposition particles ejected from nozzles 101 far from the center, in the long axis direction of the line source 100 (the X direction in (a) of FIG. 11), of the line source 100 and near opposite ends, in the long axis direction of the line source 100 (the X direction in (a) of FIG. 11), of the line source 100 do not reach the substrate 104 and, instead, adhere to the deposition preventer plates 102 or end up scattering within a vacuum chamber through an area where no deposition preventer plates 102 are present.

Meanwhile, the line source 100 is configured to (i) move in a length direction of the substrate 104, that is, in either one of "DIRECTIONS OF MOVEMENT OF LINE SOURCE" in (b) of FIG. 11 and (ii) cause vapor deposition particles to be ejected only while the line source 100 is staying above a vapor-deposition area of the substrate 104 and stop the ejection of the vapor deposition particles while the line source 100 is passing over a non-vapor-deposition area of the substrate 104 (see (b) of FIG. 11).

As described earlier, the conventional line source 100 has the circular nozzles 101. Therefore, vapor deposition particles ejected from each of the circular nozzles 101 will widely spread as they travel, also in the Y direction in (b) of FIG. 11. For the purpose of preventing the vapor deposition particles from spreading to the non-vapor-deposition area of the substrate 104, deposition preventer plates 105 are provided.

The following will consider the use efficiency of the vapor deposition material in regard to the Y direction shown in (b) of FIG. 11. A length of the line source 100 in a short axis direction of the line source 100 (the Y direction in (b) of FIG. 11) is much shorter than the length of the substrate 104, and an area in which the line source 100 and the substrate 104 face each other is also small. Therefore, a vapor-deposition area of the substrate 104 is small, and most of the substrate 104 is occupied by a non-vapor-deposition area. If vapor deposition particles ejected from the circular nozzles 101 do not reach the vapor-deposition area of the substrate 104, such vapor deposition particles will all result in loss of the vapor deposition material. That is, such vapor deposition particles adhere to the deposition preventer plates 105 or end up scattering within a vacuum chamber through an area where no deposition preventer plates 105 are present.

It is clear from the above description that many of the vapor deposition particles, which have been ejected from each of the circular nozzles 101 and spread, do not reach the vapor-deposition area of the substrate 104 and are not utilized effectively (that is, only a small percentage of the vapor deposition particles are utilized effectively).

One way to solve such an issue is to increase the length of the line source 100 in the short axis direction of the line source 100 (the Y direction in (b) of FIG. 11) and thereby increase the vapor-deposition area of the substrate 104. However, doing so will result in a great increase in size of a vapor deposition device, a reduction in productivity, and the like.

Furthermore, in a case of organic EL display devices in recent years, it is necessary that vapor deposition particles be incident on the substrate 104 so as to form a large angle with the substrate 10, because of concerns about adverse effects on device characteristics of the organic EL display devices, concerns about shadow that may occur in a case where selective deposition using a mask such as a fine metal mask (FMM) is employed, and the like concerns. This restricts the length of the line source 100 in the short axis direction of the line source 100 (the Y direction in (b) of FIG. 11) to a greater extent.

As has been described, the use of the conventional line source 100 results in very poor use efficiency of the vapor deposition material.

Meanwhile, Patent Literatures 1 and 2 disclose cases in which nozzles each have a shape (shape of an opening) other than a circular shape.

Patent Literature 1 discloses substantially improving uniformity of the amount of ejection of a vapor deposition material stored along a length direction of a line source, by changing at least one of the following: a size of each vapor outlet opening; and an interval between adjacent vapor outlet openings.

Figure 12:
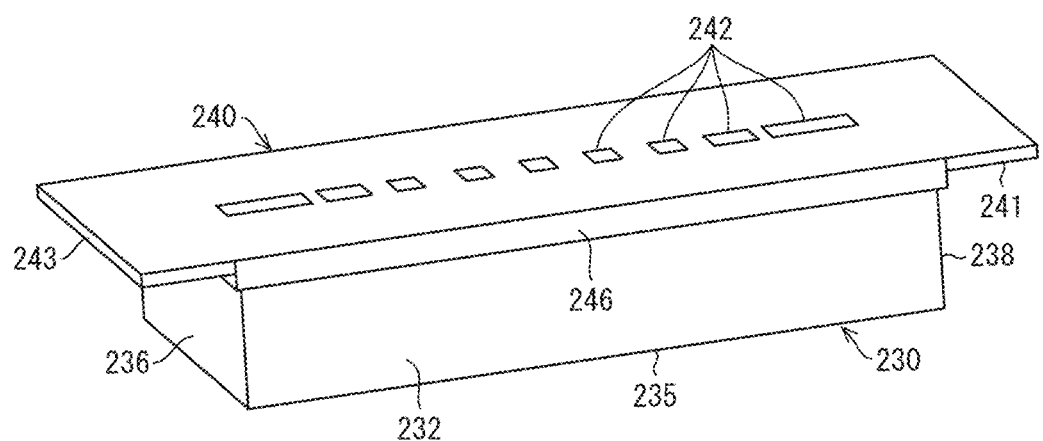

FIG. 12 schematically illustrates configurations of an evaporating heater and an electrically insulating container, which constitute the line source disclosed in Patent Literature 1.

As illustrated in FIG. 12, a long electrically insulating container 230, which stores a solid organic material therein, is defined by a side wall 232, a side wall (not illustrated) opposite the side wall 232, an end wall 236, an end wall 238, and a bottom wall 235. The side walls and the end walls are connected to a single top face. The electrically insulating container 230 has a lid, which is constituted by an evaporating heater 240. The evaporating heater 240 is sealed on the top face of the electrically insulating container 230 with a sealing flange 246, which is part of the evaporating heater 240. The evaporating heater 240 is substantially flat and includes electric connection flanges 241 and 243.

The evaporating heater 240 has a plurality of vapor outlet openings 242, which are through-holes passing through the evaporating heater 240 and which are arranged on a center line running along the length of the evaporating heater 240. The vapor outlet openings 242 are arranged such that vapor of the organic material generated inside the electrically insulating container 230 is discharged outward through the vapor outlet openings 242.

As illustrated in FIG. 12, some of the plurality of vapor outlet openings 242 have a slit shape (i.e., the length and width are not equal). However, the length and width of each of the vapor outlet openings 242 are selected merely to substantially improve the uniformity of the amount of ejection of the vapor deposition material stored along a long axis direction of the line source, and therefore are at least not designed to control a scattering range, in which vapor deposition particles scatter in a width direction of an outlet opening 242 provided in parallel to a short axis direction of the line source, to become narrow. Furthermore, vapor outlet openings 242 around the center in the length direction of the line source do not even have a slit shape. In addition, no particular consideration was given to the depth of each of the vapor outlet openings 242 in the evaporating heater 240. That is, the vapor outlet openings 242 are not designed to have a depth that makes it possible to control the scattering range, in which the vapor deposition particles scatter in the width direction of the vapor outlet opening 242 provided in parallel to the short axis direction of the line source, to become narrow.

That is, the shape of each of the vapor outlet openings 242 disclosed in Patent Literature 1 is not a slit shape that is specifically designed to achieve a sufficient anisotropic effect in a length direction of a vapor outlet opening 242 and in the width direction of the vapor outlet opening 242. Therefore, use of the line source disclosed in Patent Literature 1 will also result in very poor use efficiency of the vapor deposition material.

Patent Literature 2 discloses a vapor deposition source device including a mask with an opening. Patent Literature 2 states that, in the mask, a bridge in parallel to the short axis of the opening is formed across the opening to give a plurality of slits, and that such bridging makes it possible to prevent or reduce a change in width of each of the slits, which change may result from thermal expansion, and thus possible to improve uniformity of the thickness of a metal film in a width direction of the metal film.

However, in the mask of the vapor deposition source device disclosed in Patent Literature 2, no particular consideration was given to the depth of each of the plurality of slits. That is, the slits in the mask are not designed to have a depth that makes it possible to control a scattering range, in which the vapor deposition particles scatter in a width direction of a slit provided in parallel to a short axis direction of the mask, to become narrow.

As such, use of the vapor deposition source device disclosed in Patent Literature 2 cannot improve the use efficiency of the vapor deposition material, either.

The present invention was made in view of the above issues, and it is an object of the present invention to provide a vapor deposition source, a vapor deposition device, and a method of forming a vapor-deposited film, which are capable of achieving uniform film thickness distribution and also achieving high use efficiency of a vapor deposition material.

Solution to Problem

In order to attain the above object, a vapor deposition source in accordance with the present invention has a surface which has a plurality of openings via which vapor deposition particles are ejected, the vapor deposition source being configured to have a first length in a first direction and a second length in a second direction which is orthogonal to the first direction, the first length being longer than the second length, the first direction and the second direction being in a same plane, the plurality of openings each having a slit shape defined by (i) two first sides which face each other and (ii) two second sides which face each other, the two first sides being parallel to the first direction and being equal in length, the two second sides being parallel to the second direction and being equal in length, the plurality of openings being arranged, at regular intervals, linearly along the first direction, the two first sides each being not less than 4 times and not more than 50 times as long as each of the two second sides, the two second sides each having a length of not less than 1 mm and not greater than 5 mm, the plurality of openings each having a depth in a third direction that is orthogonal to the first direction and the second direction, the depth being not less than 5 mm and not greater than 20 mm.

According to the above arrangement, in regard to each of the plurality of openings, each of the first sides is not less than 4 times and not more than 50 times as long as each of the second sides, the second sides each have a length of not less than 1 mm and not greater than 5 mm, and the depth in the third direction that is orthogonal to the first direction and the second direction is not less than 5 mm and not greater than 20 mm. That is, each of the plurality of openings has a specific slit shape that brings about a sufficient anisotropic effect in the first direction from the openings and in the second direction from the openings. Furthermore, each of the plurality of openings is provided in the vapor deposition source in a manner such that its longer sides extend along the first direction.

Therefore, the openings make it possible to control a scattering range of the vapor deposition particles to become wide in the first direction and narrow in the second direction. This makes it possible to provide a vapor deposition source that can achieve uniform film thickness distribution and also achieve high use efficiency of vapor deposition materials.

A vapor deposition device in accordance with the present invention includes the vapor deposition source.

According to the above arrangement, since the vapor deposition device includes the vapor deposition source, it is possible to achieve uniform film thickness distribution and also achieve high use efficiency of vapor deposition materials.

A method of forming a vapor-deposited film in accordance with the present invention is a method of forming a vapor-deposited film on a substrate with use of the vapor deposition source, the method including the step of: carrying out vapor deposition while moving, along the second direction, at least one of the substrate and the vapor deposition source.

The above method makes it possible to achieve uniform thickness distribution in a film formed on the substrate and also achieve high use efficiency of vapor deposition materials.

Advantageous Effects of Invention

According to an aspect of the present invention, it is possible to provide a vapor deposition source, a vapor deposition device, and a method of forming a vapor-deposited film, which are capable of achieving uniform film thickness distribution and also achieving high use efficiency of vapor deposition materials.

Figure 1:
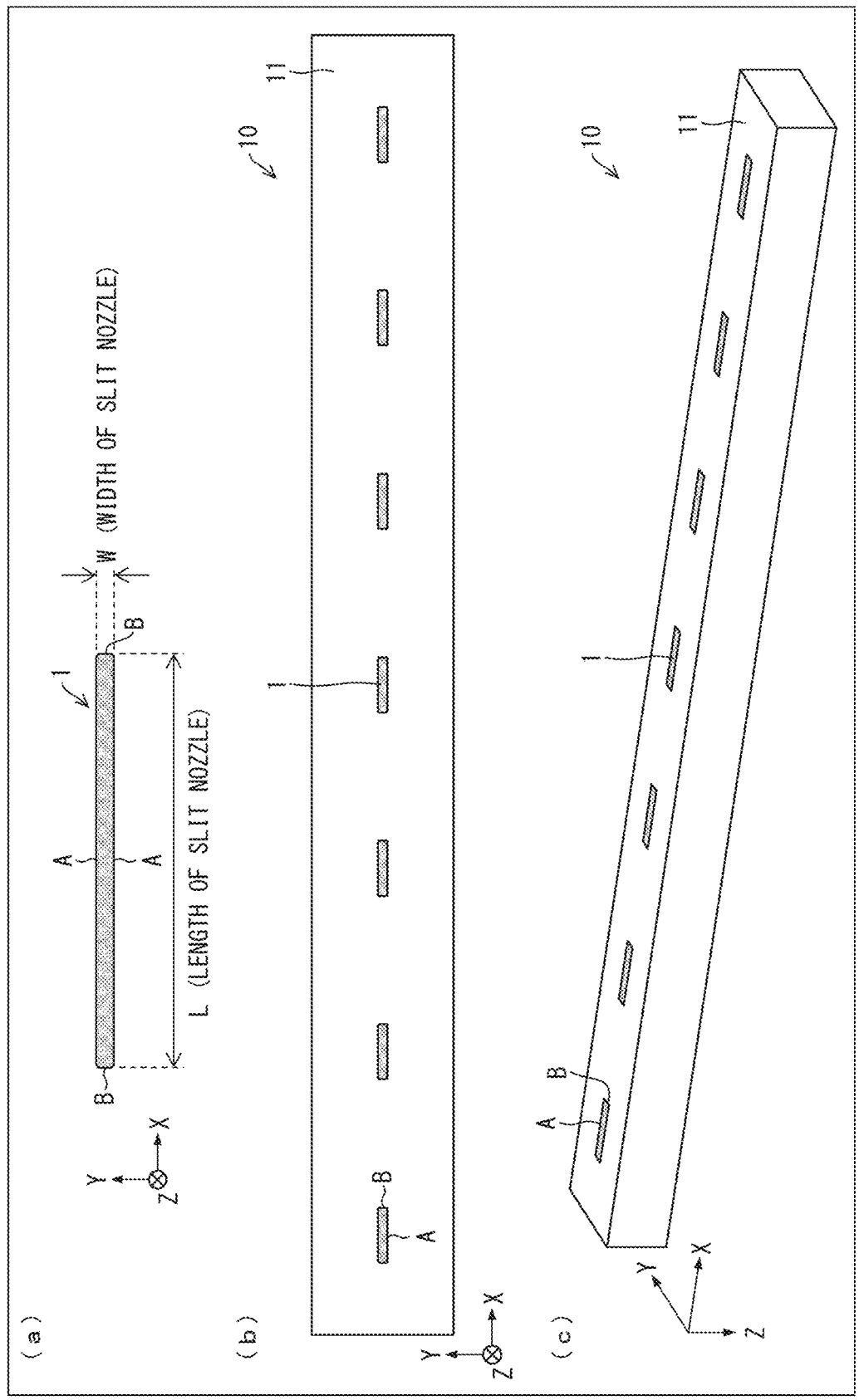

BRIEF DESCRIPTION OF DRAWINGS (a) to (c) of FIG. 1 illustrate a shape of a line source in accordance with Embodiment 1 of the present invention and a shape of a slit nozzle of the line source.

Figure 2:
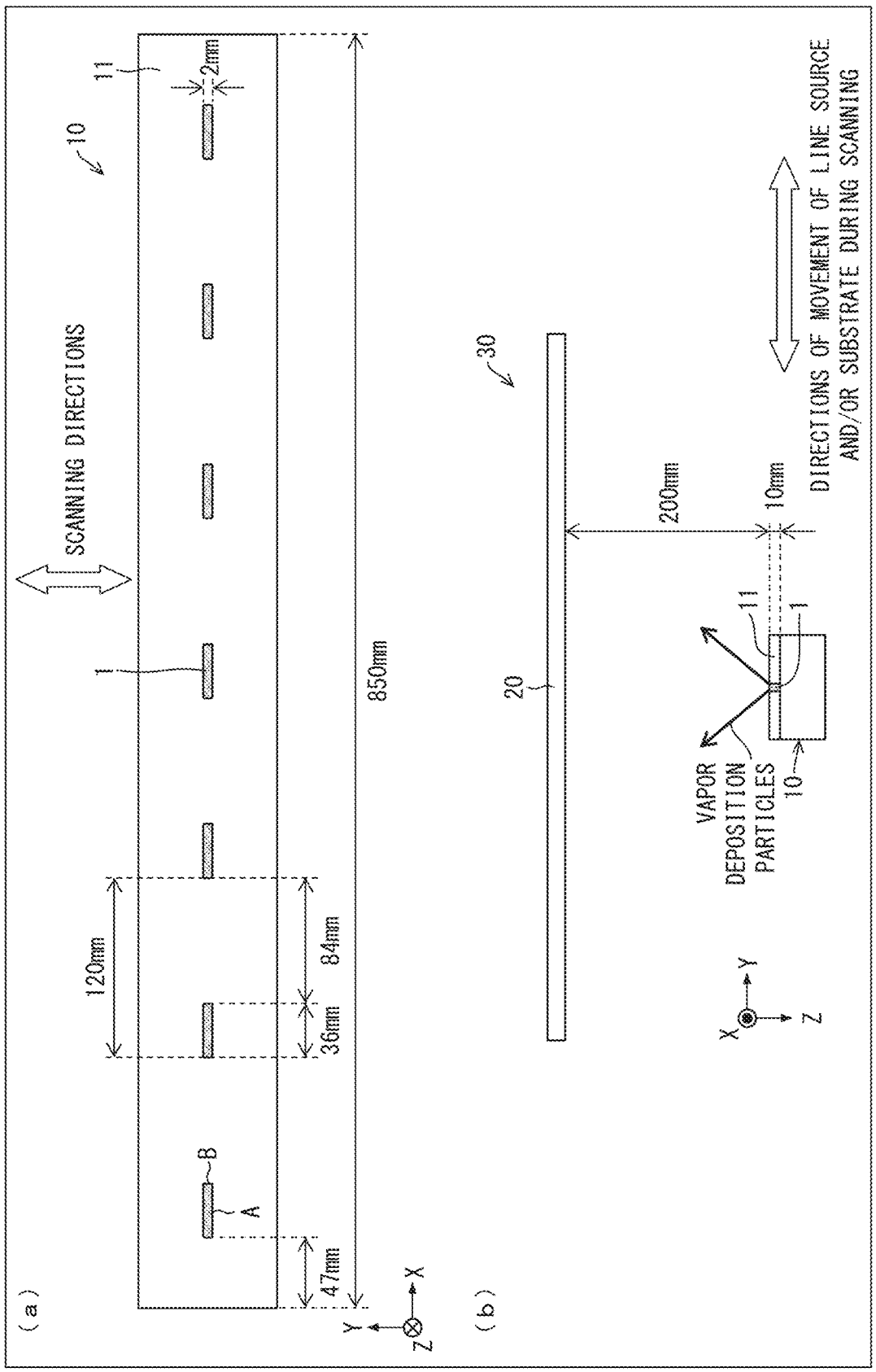

(a) of FIG. 2 illustrates a top plate of the line source in accordance with Embodiment 1 of the present invention. (b) of FIG. 2 illustrates a vapor deposition device including the line source and a substrate.

(a) of FIG. 3 is drawn for explaining a directivity of vapor deposition particles along a width direction of a slit nozzle. (b) of FIG. 3 is drawn for explaining a directivity of vapor deposition particles along a length direction of a slit nozzle.

(a) of FIG. 4 is a graph showing a relationship between a directivity (n-value) of vapor deposition particles along the width direction of the slit nozzle and a length-to-width ratio of a slit nozzle. (b) of FIG. 4 is a graph showing a relationship between a directivity (n-value) of vapor deposition particles along the length direction of the slit nozzle and the length-to-width ratio of a slit nozzle.

Figure 5:
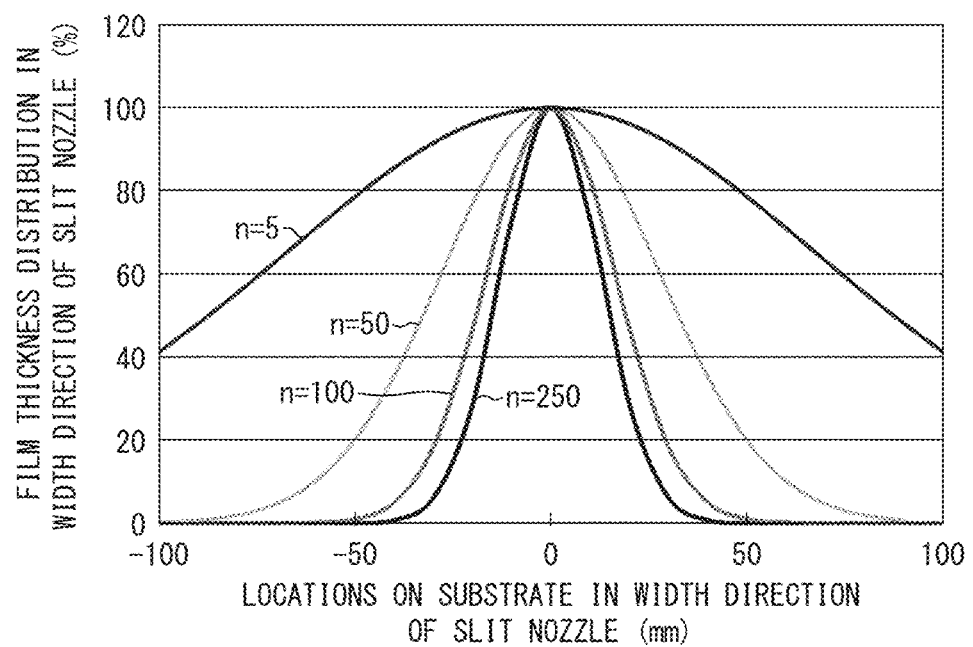

FIG. 5 is a graph showing a relationship between a thickness distribution of a vapor-deposited film on a substrate in the width direction of the slit nozzle and n-values for the width direction of the slit nozzle.

(a) and (b) of FIG. 6 are graphs obtained in a case where a vapor-deposited film is formed on the substrate with the use of the vapor deposition device illustrated in (b) of FIG. 2. (a) of FIG. 6 is a graph showing a thickness distribution of the vapor-deposited film on the substrate in the long axis direction of the line source. (b) of FIG. 6 is a graph showing a thickness distribution of the vapor-deposited film on the substrate in the short axis direction of the line source.

Figure 7:
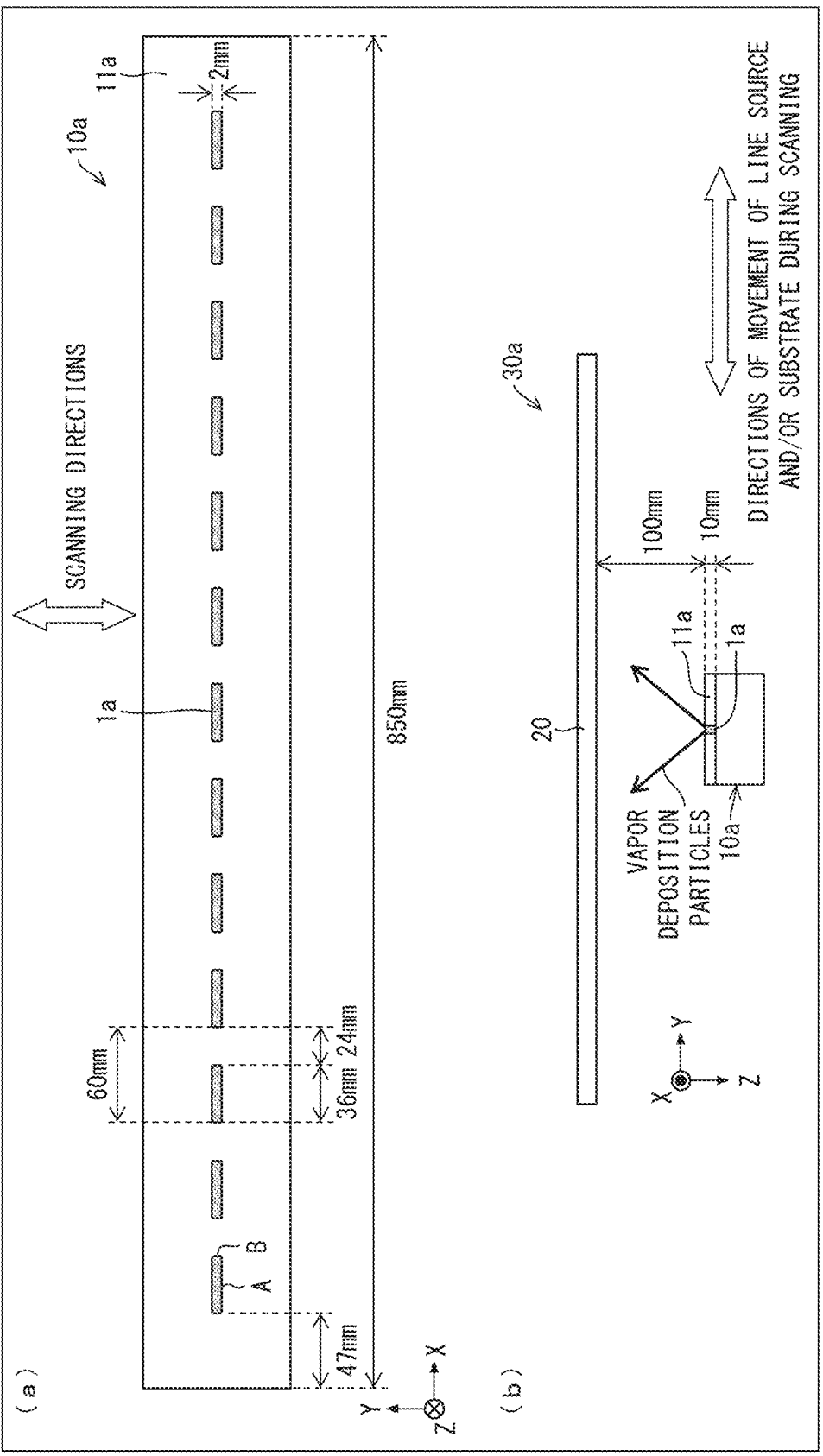

(a) of FIG. 7 illustrates a top plate of a line source in accordance with Embodiment 2 of the present invention. (b) of FIG. 7 illustrates a vapor deposition device including the line source and a substrate.

(a) and (b) of FIG. 8 are graphs obtained in a case where a vapor-deposited film is formed with the use of the vapor deposition device illustrated in (b) of FIG. 7. (a) of FIG. 8 is a graph showing a thickness distribution of the vapor-deposited film on the substrate in a long axis direction of the line source. (b) of FIG. 8 is a graph showing a thickness distribution of the vapor-deposited film on the substrate in a short axis direction of the line source.

Figure 9:
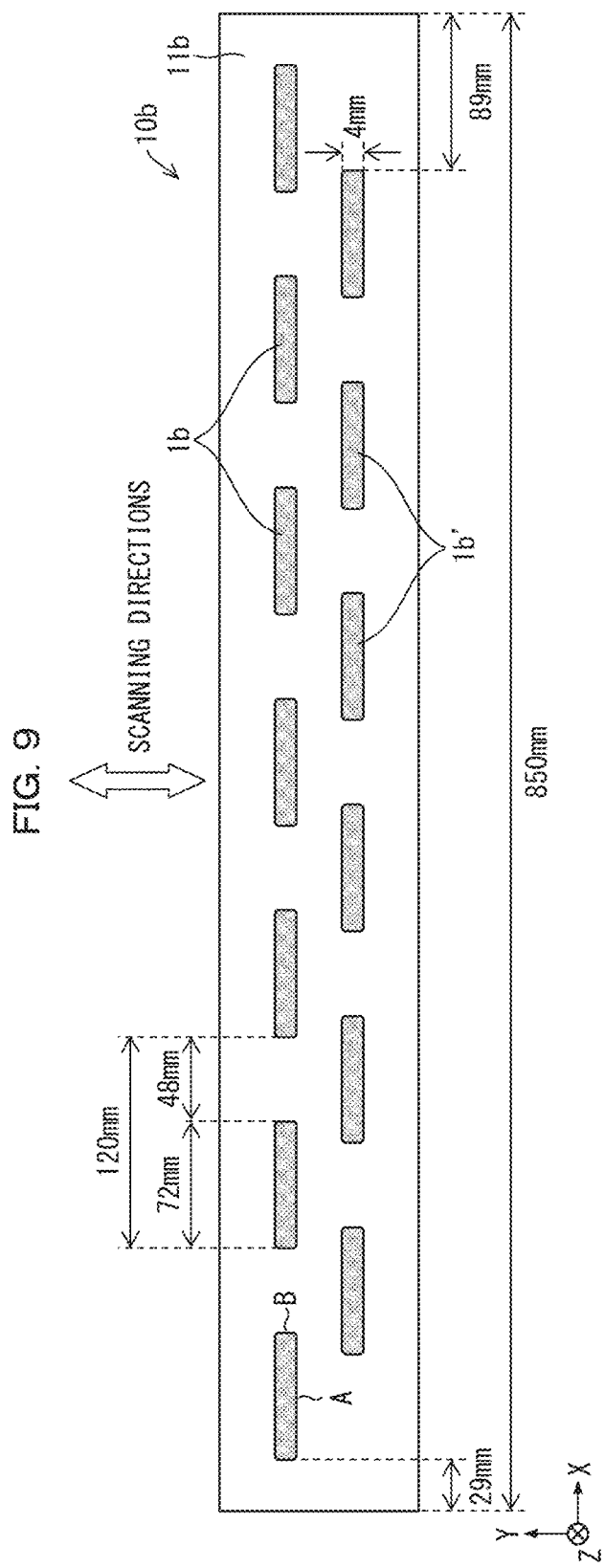

FIG. 9 illustrates a top plate of a line source in accordance with Embodiment 3 of the present invention.

(a) of FIG. 10 is a top view schematically illustrating a shape of a conventional line source. (b) of FIG. 10 is a perspective view schematically illustrating the shape of the conventional line source.

(a) and (b) of FIG. 11 are drawn for explaining why use efficiency of the vapor deposition material is poor in a case where the conventional line source illustrated in (a) and (b) of FIG. 10 is used.

FIG. 12 schematically illustrates configurations of an evaporating heater and an electrically insulating container, which constitute the line source disclosed in Patent Literature 1.

DESCRIPTION OF EMBODIMENTS

The following description will discuss embodiments of the present invention with reference to FIGS. 1 through 9.

For convenience, members having functions identical to those illustrated in a specific embodiment are assigned identical referential numerals and their descriptions may be omitted.

Embodiment 1

The following description will discuss, with reference to FIGS. 1 through 6, (i) a line source 10 (vapor deposition source) for forming a vapor-deposited film on a substrate in a process of producing, for example, an organic EL (electroluminescent) display device and (ii) a vapor deposition device 30 including the line source 10.

(a) of FIG. 1 is a plan view illustrating a shape of a slit nozzle 1 of the line source 10. (b) of FIG. 1 is a plan view illustrating a shape of the line source 10. (c) of FIG. 1 is a perspective view illustrating the shape of the line source 10.

(a) of FIG. 1 illustrates the shape of the slit nozzle 1 of the line source 10. As illustrated in (a) of FIG. 1, the slit nozzle 1 has (i) a length L in an X-axis direction (first direction) and (ii) a width W in a Y-axis direction (second direction). The length L is greater than the width W. The slit nozzle 1 has a predetermined depth in a Z-axis direction (third direction) which is orthogonal to the X-axis direction and the Y-axis direction. Note that the Y-axis direction (second direction) of the slit nozzle 1 is orthogonal, in the same plane, to the X-axis direction (first direction) of the slit nozzle 1. In other words, the slid nozzle 1 has a slit shape that is defined by two first sides A and two second sides B. The two first sides A are equal in length to each other and face each other. The two second sides B are equal in length to each other and face each other.

As illustrated in (b) and (c) of FIG. 1, the line source 10 has a shape of a quadratic prism that is longer in the X-axis direction (first direction) than in the Y-axis direction (second direction) orthogonal to the X-axis direction. Hereinafter, the X-axis direction is referred to as a length direction and the Y-axis direction is referred to as a width direction.

The line source 10 is a vapor deposition source configured to eject vapor deposition particles. The line source 10 can be a container which is configured to directly store a vapor deposition material therein. Alternatively, the line source 10 can have piping of a load lock system and can be configured so that a vapor deposition material is externally supplied through the load lock pipe.

The line source 10 has a top plate 11. The top plate 11 has a plurality of slit nozzles 1, each of which is an ejection opening in the form of a nozzle (in the form of a tube). The plurality of slit nozzles 1 each have a slit shape defined by two first sides A and two second sides B. The first two sides A are equal in length and parallel to each other in the X-axis direction so as to face each other, when viewed from above. The second two sides B are equal in length and parallel to each other in the Y-axis direction (i.e., in the short axis direction of the line source 10) so as to face each other, when viewed from above.

Embodiment 1 discusses with a configuration example for up-deposition in which the top plate 11 of the line source 10 has the plurality of slit nozzles 1. Note, however, that Embodiment 1 is not limited as such. For example, the plurality of slit nozzles 1 can be alternatively configured to be provided in a surface at the bottom of the line source 10. Such an alternative configuration can be suitable for down-deposition.

The line source 10 is configured to heat a vapor deposition material so as to (i) evaporate the vapor deposition material (in a case where the vapor deposition material is a liquid material) or (ii) sublime (in a case where the vapor deposition material is a solid material). This causes vapor deposition particles to be generated in the form of gas so that the vapor deposition particles are ejected outward through the slit nozzles 1. For the purpose of preventing the vapor deposition material from clogging, the top plate 11 of the line source 10 is heated to a temperature equal to or above the evaporation temperature of or sublimation temperature of the vapor deposition material.

The top plate 11 of the line source 10 has the plurality of slit nozzles 1 which are arranged linearly, at regular intervals, in a row along the X-axis direction (i.e., arranged in a long axis direction of the line source 10).

(a) of FIG. 2 is a plan view illustrating the shape of the line source 10, and the plan view exemplifies dimensions. (b) of FIG. 2 schematically illustrates a configuration of a main part of the vapor deposition device 30 including the line source 10 and a substrate 20.

As illustrated in (a) and (b) of FIG. 2, according to Embodiment 1, a line source 10, which is 850 mm long in the long axis direction of the line source 10 (the X-axis direction in (a) and (b) of FIG. 2), is employed in order to uniformly form a vapor-deposited film in a width direction of the substrate 20. Note that such a line source 10 is employed by taking it into consideration that (i) the substrate 20, having a width of 600 mm, is employed and (ii) a distance from the top plate 11 of the line source 10 to the substrate 20 is 200 mm. Note, however, that Embodiment 1 is not limited as such. A preferred length of the line source 10 in the long axis direction of the line source 10 (the X-axis direction in (a) and (b) of FIG. 2) can differ depending on the width of the substrate 20, the number of the slit nozzles 1 in the top plate 11 of the line source 10, the distance from the top plate 11 of the line source 10 to the substrate 20, and/or the like.

As illustrated in (a) of FIG. 2, the length of the line source 10 is 850 mm in the long axis direction of the line source 10 (the X-axis direction in (a) of FIG. 2), the width of each of the slit nozzles 1 is 2 mm, and the length of each of the slit nozzles 1 is 36 mm. The number of the plurality of slit nozzles 1 is 7, and the seven slit nozzles 1 are linearly arranged in a row along the long axis direction of the line source 10 (the X-axis direction in (a) of FIG. 2) at a pitch of 120 mm that is the sum of a length of a slit nozzle 1 (the length is 36 mm) and an interval between two adjacent slit nozzles 1 (the interval is 84 mm). Each of the slit nozzles 1 is located substantially in the middle in the short axis direction of the line source 10 (the Y-axis direction in (a) of FIG. 2). In other words, the slit nozzles 1 are arranged at a pitch (i.e., a distance between left ends of adjacent slit nozzles 1) of 120 mm. Note that (i) a distance between a leftmost end of the line source 10 and a leftmost end of the slit nozzle 1 is 47 mm and (ii) a distance between a rightmost end of the line source 10 and a rightmost end of the slit nozzle 1 is 47 mm. An interval between adjacent slit nozzles 1 is 84 mm. It should be understood that the specific dimensions, the number of the slit nozzles 1, and the like illustrated in (a) of FIG. 2 are illustrative only.

Embodiment 1 discusses with the example in which the width of each of the slit nozzles 1 is 2 mm. Note, however, that Embodiment 1 is not limited as such. The width of each of the slit nozzles 1 is not particularly limited, provided that the width is not less than 1 mm and not greater than 5 mm. If the width of each of the slit nozzles 1 is less than 1 mm, then an issue arises in which, for example, the processability of the slit nozzles 1 decreases and/or ejection efficiency of vapor deposition particles decreases. If the width of each of the slit nozzles 1 is greater than 5 mm, then it becomes difficult to control a scattering range, in which the vapor deposition particles scatter in a width direction of a slit nozzle 1, to become narrow.

In Embodiment 1, as illustrated in (a) and (b) of FIG. 2, vapor deposition is carried out by the line source 10 while the line source 10 is being moved (relatively moved) with respect to the substrate 20 such that the width direction of the slit nozzle 1 (the Y-axis direction in (a) and (b) of FIG. 2) is parallel to a scanning direction (a direction in which the substrate is scanned). Note, however, that Embodiment 1 is not limited as such. Alternatively, the following arrangement can be employed: the substrate 20 is moved (relatively moved) with respect to the line source 10 such that the width direction of the slit nozzle 1 (the Y-axis direction in (a) and (b) of FIG. 2) is parallel to the scanning direction. Alternatively, the following arrangement can be employed: both the line source 10 and the substrate 20 are moved along the width direction of the slit nozzle 1 (the Y-axis direction in (a) and (b) of FIG. 2) such that the width direction of the slit nozzle 1 (the Y-axis direction in (a) and (b) of FIG. 2) is parallel to the scanning direction.

Embodiment 1 discusses with the example in which the depth, in the Z-axis direction (third direction), of each of the plurality of slit nozzles 1 in the top plate 11 of the line source 10 is 10 mm (see (b) of FIG. 2). Note, however, that the depth of each of the slit nozzles 1 is not limited to 10 mm, provided that the depth is not less than 5 mm and not greater than 20 mm. This is because (i) if the depth of each of the slit nozzles 1 is too shallow (i.e., if the depth is less than 5 mm), then an issue arises in which an anisotropy in vapor deposition distribution becomes weak and (ii) if the depth of each of the slit nozzles 1 is too deep (i.e., if the depth is greater than 20 mm), then, for example, processability of the slit nozzles 1 decreases and/or the slit nozzles 1 become prone to clogging.

It is still unknown about a detailed mechanism in which directional distribution (also called anisotropy), i.e., directivity, occurs in vapor deposition particles ejected from slit nozzles of a line source. It is believed that (i) thermal energy provided by the slit nozzles and (ii) a phenomenon in which the vapor deposition particles collide with each other during passing through the slit nozzles, and the like correlate each other, so that a final directional distribution occurs.

A parameter generally used to represent the directional distribution, i.e., directivity, which occurs in vapor deposition particles ejected from silt nozzles of a line source, is a parameter called "n-value". The n-value can be represented by Equation (1) below. In some cases, the "n+3" in Equation (1) is used as an "n-value."

$$R = R_0 \times \cos^{n+3}\theta \quad \text{Equation (1)}$$

In Equation (1): R represents a thickness of a vapor-deposited film at a location (first location), on a substrate 20, which location is defined by an angle θ to a vertical line of a corresponding slit nozzle 1; $R_0$ represents a thickness of the vapor-deposited film, on the substrate 20, at a location (second location), at which location the vertical line of the corresponding slit nozzle 1 meets the substrate 20; and the angle θ represents an angle at which the line, which is drawn from the corresponding slit nozzle 1 to the first location, is with the vertical line of the corresponding slit nozzle 1.

As is clear from Equation (1), the thickness of the vapor-deposited film is largest, on the substrate 20, at a location right above the corresponding slit nozzle and becomes smaller with increasing distance from that location. The n-value is a parameter representing the directivity of the nozzle, and therefore a larger n-value means a higher directivity. It follows that, in a case where a vapor deposition source has only one slit nozzle, a thickness distribution of a vapor-deposited film formed from vapor deposition particles ejected from this vapor deposition source becomes less uniform as the n-value becomes larger.

(a) and (b) FIG. 3 illustrate a case in which Equation (1) is applied to Embodiment 1. (a) of FIG. 3 is drawn for explaining a directivity of vapor deposition particles along a width direction of a slit nozzle 1. (b) of FIG. 3 is drawn for explaining a directivity of vapor deposition particles along a length direction of a slit nozzle 1.

As is clear from (a) of FIG. 3, the thickness of a vapor-deposited film 21, which is formed from vapor deposition particles ejected from a vapor deposition source 10U having only one slit nozzle 1, is small in the width direction of the slit nozzle 1 (in the Y-axis direction in (a) of FIG. 3) even at a location which is a little away from a location right above the slit nozzle 1. (That is, the n-value is relatively large. This will be discussed later in detail.) This means that the slit nozzle 1 has a shape that provides a high directivity along the width direction of the slit nozzle 1 (the Y-axis direction in (a) of FIG. 3).

On the other hand, as is clear from (b) of FIG. 3, the thickness of the vapor-deposited film 21, which is formed from vapor deposition particles ejected from the vapor deposition source 10U having only one slit nozzle 1, is relatively large in the length direction of the slit nozzle 1 (the X-axis direction in (b) of FIG. 3) even at a location which is a little away from the location right above the slit nozzle 1. (That is, the n-value is relatively small. This will be discussed later in detail.) This means that the slit nozzle 1 has a shape that provides a low directivity along the length direction of the slit nozzle 1 (the X-axis direction in (b) of FIG. 3).

(a) and (b) of FIG. 4 are graphs obtained in a case where a vapor-deposited film is formed on the substrate 20 with the use of the vapor deposition device 30 illustrated in (b) of FIG. 2. (a) of FIG. 4 is a graph showing a relationship between a directivity (n-value) of vapor deposition particles along a width direction of a slit nozzle and a length-to-width ratio of a slit nozzle (hereinafter referred to as "slit nozzle's length-to-width ratio"). (b) of FIG. 4 is a graph showing a relationship between a directivity (n-value) of vapor deposition particles along a length direction of a slit nozzle and the slit nozzle's length-to-width ratio.

As is shown in (a) of FIG. 4, since each of the slit nozzles 1 of the line source 10 has a width of 2 mm and a length of 36 mm, (i) a corresponding slit nozzle's length-to-width ratio (see the horizontal axis of (a) of FIG. 4) is 18 and (ii) a corresponding n-value in the width direction of the slit nozzle (see the vertical axis of (a) of FIG. 4) is about 250. This means that the slit nozzles 1 each have a shape that provides a high directivity along the width direction of the slit nozzle 1.

As is clear from (b) of FIG. 4, since each of the slit nozzles 1 of the line source 10 has a width of 2 mm and a length of 36 mm, (i) a corresponding slit nozzle's length-to-width ratio on the horizontal axis of (b) of FIG. 4 is 18 and (ii) a corresponding n-value in the length direction of the slit nozzle (see the vertical axis of (b) of FIG. 4) is about 3. This means that the slit nozzles 1 each have a shape that provides a low directivity along the length direction of the slit nozzle 1.

That is, each of the slit nozzles 1 of the line source 10 has a specific slit shape that brings about a sufficient anisotropic effect in the width direction of the slit nozzle 1 and in the length direction of the slit nozzle 1.

FIG. 5 is a graph obtained in the case where the vapor-deposited film is formed on the substrate 20 with the use of the vapor deposition device 30 illustrated in (b) of FIG. 2. The graph of FIG. 5 shows a relationship between (i) a thickness distribution of a vapor-deposited film on the substrate 20 in the width direction of the slit nozzle 1 and (ii) n-values in the width direction of the slit nozzle 1.

As is clear from the thickness distribution of the vapor-deposited film on the substrate 20 in the width direction of the slit nozzle 1, the vapor-deposited film on the substrate 20 is formed, more notably, only within a very narrow region along the width direction of the slit nozzle 1 as the n-value in the width direction of the slit nozzle 1 becomes larger.

(a) and (b) of FIG. 6 are graphs obtained in the case where the vapor-deposited film is formed on the substrate 20 with the use of the vapor deposition device 30 illustrated in (b) of FIG. 2. (a) of FIG. 6 is a graph showing a thickness distribution of the vapor-deposited film on the substrate 20 in the long axis direction of the line source 10. (b) of FIG. 6 is a graph showing a thickness distribution of the vapor-deposited film on the substrate 20 in the short axis direction of the line source 10.

As illustrated in (a) of FIG. 6, the thickness distribution, in the long axis direction of the line source 10, of the vapor-deposited film on the substrate 20 is approximately flat. It is therefore possible to realize an approximately uniform thickness distribution. Specifically, in a "WIDTH OF SUBSTRATE 600 mm" region, a thickness distribution of ±5% was obtained, and, in a region of 500 mm that is within the "WIDTH OF SUBSTRATE 600 mm" region, a thickness distribution of ±2% was obtained.

As is clear from (b) of FIG. 6, few vapor deposition particles reach outside an area located within ±30 mm in the width direction of a slit nozzle of the substrate 20. This is because the n-value in the width direction of the slit nozzle is about 250 in each of the slit nozzles 1 of the line source 10. As such, it is possible to form a vapor-deposited film on the substrate 20 only within a very narrow area along the width direction of the slit nozzle (within an area located within ±30 mm of the substrate 20 in the width direction of the slit nozzle).

It is therefore possible to prevent vapor deposition particles from scattering, in the width direction of the slit nozzle, within a vacuum chamber, unlike the conventional techniques in which a deposition preventer plate (also referred to as a control plate) is employed.

As such, it is possible to provide a line source 10 and a vapor deposition device 30 which are capable of achieving high in-plane uniformity of a vapor-deposited film, high material use efficiency, highly accurate mask vapor deposition, and size reduction.

Embodiment 1 discusses with an example in which each of the slit nozzles 1 of the line source 10 has a width of 2 mm, a length of 36 mm, and a length-to-width ratio of 18 as shown in (a) and (b) of FIG. 4. Note, however, that Embodiment 1 is not limited as such, provided that a difference, between the n-value in the width direction of the slit nozzle and the n-value in the length direction of the slit nozzle, is equal to or greater than a slit nozzle's length-to-width ratio that can show a sufficient anisotropy in terms of the width direction of the slit nozzle and the length direction of the slit nozzle. Specifically, such a slit nozzle's length-to-width ratio is not less than 4. The slit nozzle's length-to-width ratio is preferably not less than 10. This is because such a ratio causes a further large difference between the n-value in the width direction of the slit nozzle and the n-value in the length direction of the slit nozzle. The slit nozzle's length-to-width ratio is more preferably not less than 15, which causes the n-value in the width direction of the slit nozzle to be about 250.

The following description will discuss reasons why the slit nozzle's length-to-width ratio should essentially be at least 4. The slit nozzle's length-to-width ratio should be set so that a sufficient material use efficiency is secured as has been described and, especially in organic EL display devices in recent years, concerns about adverse effects on device characteristics, concerns about shadow that may occur in a case where selective deposition using a mask such as a fine metal mask (FMM) is employed, and the like concerns are eliminated. In view of the circumstances, a vapor deposition area along the width direction of the slit nozzle (the Y-axis direction in (a) and (b) of FIG. 2) should fall within an area located within about ±50 mm of the substrate 20. In order for a material loss to be prevented, it is necessary that the n-value in the width direction of the slit nozzle have a value of about n=100 (see FIG. 5). As such, the slit nozzle's length-to-width ratio should be not less than 4, which comes of (a) of FIG. 4.

Note that, if the slit nozzle's length-to-width ratio is too large, then the thickness distribution of the vapor-deposited film on the substrate 20 in the length direction of the slit nozzle may cause a decrease in uniformity. As shown in (b) of FIG. 4, the n-value in the length direction of the slit nozzle is proportional to the slit nozzle's length-to-width ratio. It follows that the n-value in the length direction of the slit nozzle can be calculated based on the slit nozzle's length-to-width ratio. From the viewpoint of ensuring in-plane uniformity over the entire width of the substrate 20, the n-value in the length direction of the slit nozzle is preferably not more than 5, particularly preferably less than 4. Accordingly, the slit nozzle's length-to-width ratio is preferably not more than 50. The slit nozzle's length-to-width ratio is more preferably not more than 30, from the viewpoint of prevention of a significant change in vapor deposition distribution profile caused by a fluctuation in vapor deposition rate or in temperature distribution in the line source 10.

A detailed mechanism of a manifestation of anisotropy of vapor deposition distribution, like the present invention, has not been found. Such a manifestation is inferred to occur due to a strong passage confinement to which a great number of vapor deposition particles are subjected during their passing through a slit nozzle 1. In fact, the vapor deposition distribution is affected not only by the shape of each slit nozzle 1 but also by the size (length, width, and depth) of each slit nozzle 1. In order to realize manifestation of strong anisotropy of vapor deposition distribution, like Embodiment 1 of the present invention, it is essential to configure the slit nozzle as illustrated in (a) and (b) of FIG. 2. Specifically, the depth of each slit nozzle 1 is not less than 5 mm and not greater than 20 mm, the width of each slit nozzle 1 is not less than 1 mm and not greater than 5 mm, and the length (length of first side) of each slit nozzle 1 is not less than 4 times and not greater than 50 times the width (length of second side) of each slit nozzle 1. Note that if the depth of each slit nozzle 1 is too shallow (less than 5 mm), then an issue arises in which the anisotropy of vapor deposition distribution becomes weak. If the depth of each slit nozzle 1 is too deep (greater than 20 mm), then the processability of the slit nozzles 1 decreases and the slit nozzles 1 become prone to clogging.

As has been described, the thickness distribution of a vapor-deposited film on the substrate 20 should be uniform across the long axis of the line source 10. To that end, it is essential that vapor deposition particles, ejected from a plurality of slit nozzles 1, are superposed on the substrate 20. From this point of view, the number of the slit nozzles 1 is appropriately selected, as illustrated in (a) of FIG. 2. In a case of a line source of a normal size, the number of the slit nozzles 1 is preferably at least 5. As such, the length of each of the slit nozzles 1 is also restricted by the number of the slit nozzles 1.

Embodiment 1 discusses with the example in which, as illustrated in (a) of FIG. 2, the slit nozzles 1 are arranged such that the sum of the length (36 mm) of a slit nozzle 1 and an interval (84 mm) between two adjacent slit nozzles 1 is 120 mm, that is, the slit nozzles 1 are arranged at a pitch (i.e., a distance between left ends of adjacent slit nozzles 1) of 120 mm. In this regard, too small an interval between adjacent slit nozzles 1 is not preferred. This is because, for example, components become difficult to fabricate with accuracy or are subjected to be affected by deformation due to thermal expansion. In contrast, if the interval between adjacent slit nozzles 1 becomes too large, then it becomes difficult to achieve in-plane uniformity of the vapor-deposited film over the entire width of the substrate 20. Therefore, the sum of the interval between two adjacent slit nozzles 1 and the length of a slit nozzle 1 is preferably not less than 1.5 times the length of the slit nozzle 1 and not more than 0.2 times the length of the line source 10.

Embodiment 1 discusses with the example in which the line source 10 and the vapor deposition device 30 are employed in a production process of an organic EL display device. Note, however, that Embodiment 1 is not limited as such. The line source 10 and the vapor deposition device 30 are applicable to every gas phase deposition technique such as vapor deposition.

Embodiment 2

The following description will discuss Embodiment 2 of the present invention with reference to (a) and (b) of FIG. 7 and FIG. 8. Embodiment 2 has the same arrangement as described in Embodiment 1, except that the interval between slit nozzles 1a is 24 mm so that (i) the pitch (distance between left ends of adjacent first slit nozzles 1a) of the slit nozzles 1a is 60 mm, (ii) the number of the slit nozzles 1a in a top plate 11a of a line source 10a is more than that of Embodiment 1, and (iii) the distance between a substrate 20 and the top plate 11a of the line source 10a is less than that of Embodiment 1. For convenience, members having functions identical to those illustrated in the drawings of Embodiment 1 are assigned identical referential numerals, and their descriptions are omitted here.

(a) of FIG. 7 illustrates the top plate 11a of the line source 10a. (b) of FIG. 7 illustrates a vapor deposition device 30a including the line source 10a and the substrate 20.

As illustrated in (a) of FIG. 7, the slit nozzles 1a are the same as the slit nozzles 1 of Embodiment 1 described earlier in that the slit nozzles 1a each have a width of 2 mm and a length of 36 mm. The slit nozzles 1a of Embodiment 2 are different from the slit nozzles 1 of Embodiment 1 in that the slit nozzles 1a of Embodiment 2 are equally spaced from each other with an interval of 24 mm between adjacent ones of the slit nozzles 1a whereas the slit nozzles 1 of Embodiment 1 are equally spaced from each other with an interval of 84 mm between adjacent ones of the slit nozzles 1.

The interval between adjacent ones of the slit nozzles 1a is reduced to 24 mm. This allows an increase in the number of the slit nozzles 1a in the top plate 11a of the line source 10a, i.e., thirteen (13) slit nozzles 1a in total. This makes it possible to increase the density of the slit nozzles 1a in the top plate 11a of the line source 10a. The thirteen slit nozzles 1a are arranged linearly in a row along a long axis direction of the line source 10a (an X-axis direction in (a) of FIG. 7) such that the sum of a length of a slit nozzle 1a (the length is 36 mm) and an interval between two adjacent slit nozzles 1a (the interval is 24 mm) is 60 mm. Each of the slit nozzles 1a is located so as to be substantially in the middle in a short axis direction of the line source 10a (a Y-axis direction in (a) of FIG. 7).

The line source 10a is arranged such that the density of the slit nozzles 1a in the top plate 11a of the line source 10a is about 2 times (more accurately, 1.86 times) that of Embodiment 1 (see (b) of FIG. 7). Therefore, even in a case where the distance between the top plate 11a of the line source 10a and the substrate 20 is 100 mm which is half that of Embodiment 1, the uniformity of thickness along the long axis direction of the line source 10a (the X-axis direction in (b) of FIG. 7) can be secured.

As illustrated in (a) and (b) of FIG. 7, the plurality of slit nozzles 1a in the top plate 11a of the line source 10a have a depth of 10 mm in a Z-axis direction (third direction) as with Embodiment 1. Note, however, that the depth is not limited to 10 mm, provided that the depth is not less than 5 mm and not greater than 20 mm.

In Embodiment 2, as illustrated in (a) and (b) of FIG. 7, vapor deposition is carried out by the line source 10a while the line source 10a is being moved (relatively moved) with respect to the substrate 20 such that a width direction of a slit nozzle 1a (the Y-axis direction in (a) and (b) of FIG. 7) is parallel to a scanning direction (a direction in which the substrate is scanned). Note, however, Embodiment 2 is not limited as such. Alternatively, the following arrangement can be employed: the substrate 20 is moved (relatively moved) with respect to the line source 10a such that the width direction of the slit nozzle 1a (the Y-axis direction in (a) and (b) of FIG. 7) is parallel to the scanning direction. Alternatively, the following arrangement can be employed: both the line source 10a and the substrate 20 are moved along the width direction of the slit nozzle 1a (the Y-axis direction in (a) and (b) of FIG. 7) such that the width direction of the slit nozzle 1a (the Y-axis direction in (a) and (b) of FIG. 7) is parallel to the scanning direction.

(a) and (b) of FIG. 8 are graphs obtained in a case where a vapor-deposited film is formed on the substrate 20 with the use of the vapor deposition device 30a illustrated in (b) of FIG. 7. (a) of FIG. 8 is a graph showing a thickness distribution of the vapor-deposited film on the substrate 20 in a long axis direction of the line source 10a. (b) of FIG. 8 is a graph showing a thickness distribution of the vapor-deposited film on the substrate 20 in a short axis direction of the line source 10a.

Note that, since each of the slit nozzles 1a of the line source 10a has a width of 2 mm and a length of 36 mm as with Embodiment 1 described earlier, the n-value in the width direction of the slit nozzle is about 250 in each of the slit nozzles 1a and the n-value in the length direction of the slit nozzle is about 3 in each of the slit nozzles 1a as with Embodiment 1 described earlier.

That is, each of the slit nozzles 1 of the line source 10a has a specific slit shape that brings about a sufficient anisotropic effect in the width direction of the slit nozzle 1a and in the length direction of the slit nozzle 1a.

As illustrated in (a) of FIG. 8, the thickness distribution, in the long axis direction of the line source, of the vapor-deposited film on the substrate 20 is approximately flat. It is therefore possible to realize an approximately uniform thickness distribution. Specifically, in a "WIDTH OF SUBSTRATE 600 mm" region, a thickness distribution of ±2% is obtained, and, in a 500 mm region that is within the "WIDTH OF SUBSTRATE 600 mm" region, a thickness distribution of ±0.5% is obtained. This means that the thickness distribution in Embodiment 2 is more uniform than that in Embodiment 1 described earlier.

As illustrated in (b) of FIG. 8, few vapor deposition particles reach outside an area located within ±20 mm in the width direction of a slit nozzle of the substrate 20. As such, it is possible to form a vapor-deposited film on the substrate 20 only within a very narrow area along the width direction of the slit nozzle (within an area located within ±20 mm of the substrate 20 in the width direction of the slit nozzle). That is, in Embodiment 2, it is possible to form a vapor-deposited film in a narrower area along the width direction of the slit nozzle on the substrate 20 than in Embodiment 1.

As described earlier, reducing the distance between the substrate 20 and the top plate 11a of the line source 10a is of great advantage, because this makes it possible to improve vapor deposition rate, improve mass productivity, and also reduce the absolute size of the vapor deposition device.

However, in a case where the distance between the substrate 20 and the top plate 11a of the line source 10a is simply reduced, it is difficult to achieve uniformity of the thickness distribution of the vapor-deposited film along the long axis direction of the line source 10a. In view of this, Embodiment 2 is arranged such that the interval between adjacent ones of the slit nozzles 1a is reduced to 24 mm so that the pitch of the slit nozzles 1a becomes 60 mm, and that the number of the slit nozzles 1a in the top plate 11a of the line source 10a is increased. Embodiment 2 thereby achieves the uniformity of thickness distribution of the vapor-deposited film along the long axis direction of the line source 10a, even in a case where the distance between the substrate 20 and the top plate 11a of the line source 10a is reduced.

It is therefore possible to prevent vapor deposition particles from scattering, in the width direction of the slit nozzle, within a vacuum chamber, unlike conventional techniques in which a deposition preventer plate (also referred to as a control plate) is employed. This makes it possible to provide a line source 10a and a vapor deposition device 30a which are capable of achieving size reduction and high use efficiency of vapor deposition materials. In regard to the vapor deposition device 30a, which includes a substrate 20 on which vapor deposition particles ejected from the slit nozzles 1a in the top plate 11a of the line source 10a are to be deposited, the distance between the top plate 11a of the line source 10a and the substrate 20 can be reduced as the sum of the interval between two adjacent slit nozzles 1a and the length of a slit nozzle 1a is reduced. Therefore, it is possible to further reduce the size of the vapor deposition device 30a.

Embodiment 3

The following description will discuss Embodiment 3 of the present invention with reference to FIG. 9. In Embodiment 3, the slit nozzle's length-to-width ratio is 18 (which is the same as those of Embodiments 1 and 2 described earlier). Therefore, each slit nozzle 1b of a line source 10b has an n-value of about 250 in the width direction of the slit nozzle and an n-value of about 3 in the length direction of the slit nozzle, although the n-values actually appear to be different from those of Embodiments 1 and 2 to some extent because the width of each slit nozzle is 4 mm (which is larger than those of Embodiments 1 and 2). Embodiment 3 is different from Embodiments 1 and 2 in that slit nozzles 1b and slit nozzles 1b' each have a length of 72 mm and a width of 4 mm (the length and width are respectively twice as large as the length and width of a slit nozzle 1 of Embodiment 1 or a slit nozzle 1a of Embodiment 2), and other arrangements of Embodiment 3 are the same as those described in Embodiment 1. For convenience, members having functions identical to those illustrated in the drawings of Embodiments 1 and 2 are assigned identical referential numerals, and their descriptions are omitted here.

FIG. 9 illustrates a top plate 11b of the line source 10b.

As illustrated in FIG. 9, the slit nozzles 1b and the slit nozzles 1b' each have a width of 4 mm and a length of 72 mm, and are arranged linearly in a plurality of rows and are arranged at regular intervals. The slit nozzles 1b are arranged in a first one of the rows such that adjacent ones of the slit nozzles 1b are separated from each other by a distance of 48 mm, and the slit nozzles 1b' are arranged in a second one of the rows such that adjacent ones of the slit nozzles 1b' are separated from each other by a distance of 48 mm. Since the slit nozzles 1b and the slit nozzles 1b' are twice as large in absolute size as the slit nozzles 1 of Embodiments 1 or the slit nozzles 1a of Embodiment 2, the slit nozzles 1b and the slit nozzles 1b' cannot be arranged in a single row along a long axis direction of the line source 10b in a manner such that the total number of the slit nozzles 1b and the slit nozzles 1b' is 13, unlike Embodiments 1 and 2. Therefore, Embodiment 3 is arranged as follows. Seven slit nozzles 1b are arranged in a first row and six slit nozzles 1b' are arranged in a second row. For the purpose of improving uniformity of film thickness in the long axis direction of the line source 10b, the slit nozzles 1b and the slit nozzles 1b' are arranged such that one slit nozzle 1b in the first row and one slit nozzle 1b' in the second row, which are adjacent to each other along a short axis direction of the line source 10b, are offset from each other along the long axis direction of the line source 10b. Specifically, for example, the slit nozzles 1b and the slit nozzles 1b' are arranged such that an area between two slit nozzles 1b adjacent to each other along an X direction in the first row in FIG. 9 has a center which is in the same position in the X direction as a center, in the X direction, of one slit nozzle 1b' in the second row (or an area between two slit nozzles 1b' adjacent to each other in the second row along the X direction has a center which is in the same position in the X direction as a center, in the X direction, of one slit nozzle 1b in the first row). That is, an area between (i) one of adjacent slit nozzles arranged in the Y direction in FIG. 9 and (ii) a slit nozzle, adjacent, in the X direction, to the one of the adjacent slit nozzles has a center which is in the same position in the X direction as a center, in the X direction, of the other of the adjacent slit nozzles arranged in the Y direction.

I is assumed in Embodiment 3 that, in a case where the line source 10b is moved in the Y direction (i.e., upward direction of "SCANNING DIRECTIONS" in FIG. 9), slit nozzles which are to reach the substrate 20 first are the slit nozzles 1b in the first row and slit nozzles which are to reach the substrate 20 after the slit nozzles 1b are the slit nozzles 1b' in the second row.

Embodiment 3 discusses with the example in which in which slit nozzles are arranged in two rows and one of the two rows has six slit nozzles 1b and the other of the two rows has seven slit nozzles 1b. Note, however, that the number of rows and the number of slit nozzles 1b per row are not limited as such. Furthermore, slit nozzles do not necessarily have to be arranged such that one slit nozzle 1b in the first row and one slit nozzle 1b' in the second row, which are adjacent to each other in the short axis direction of the line source 10b, are offset from each other along the long axis direction of the line source 10b. For example, the following arrangement can be employed: the area between two slit nozzles 1b adjacent to each other in the first row along the X direction does not have a center which is in the same position in the X direction as the center, in the X direction, of one slit nozzle 1b' in the second row.

In Embodiment 3, the slit nozzles 1b are arranged such that the sum of a length of a slit nozzle 1b (the length is 72 mm) and an interval between two adjacent slit nozzles 1b (the interval is 48 mm) is 120 mm, that is, arranged such that the pitch of the slit nozzles 1b is 120 mm as with Embodiment 1, and the slit nozzles 1b' are arranged such that the sum of a length of a slit nozzle 1b' (the length is 72 mm) and an interval between two adjacent slit nozzles 1b' (the interval is 48 mm) is 120 mm, that is, arranged such that the pitch of the slit nozzles 1b' is 120 mm as with Embodiment 1. Therefore, for the purpose of achieving uniformity of film thickness in the long axis direction of the line source 10b, the distance between the top plate 11b of the line source 10b and the substrate 20 is 200 mm as with Embodiment 1.

Furthermore, also in Embodiment 3, the plurality of slit nozzles 1b and the plurality of slit nozzles 1b' in the top plate 11b of the line source 10b have a depth of 10 mm in a Z-axis direction (third direction) as with Embodiments 1 and 2. Note, however, that the depth is not limited to 10 mm, provided that the depth is not less than 5 mm and not greater than 20 mm.

Use of the line source 10b, which has the slit nozzles 1b and the slit nozzles 1b' which are large in absolute size, makes it possible to increase vapor deposition rate and obtain high throughput.

On the other hand, simple increases in absolute size of the slit nozzles 1b and the slit nozzles 1b' will only cause non-uniformity in the film thickness distribution or will make it impossible to form a predetermined number of slit nozzles 1b in the line source 10b, for example.

Embodiment 3, in which the slit nozzles 1b and the slit nozzles 1b' are large in absolute size, is arranged so as to also satisfy the following conditions to achieve a strong anisotropy in vapor deposition distribution: the slit nozzles 1b and the slit nozzles 1b' each have a depth of not less than 5 mm and not greater than 20 mm; the slit nozzles 1b and the slit nozzles 1b' each have a width of not less than 1 mm and not greater than 5 mm; and the slit nozzles 1b and the slit nozzles 1b' each have a length (length of a first side) not less than 4 times and not more than 50 times as long as a width (length of a second side) thereof.

Therefore, it is possible to provide a line source 10b and a vapor deposition device which are capable of achieving uniformity in film thickness distribution and also achieving high use efficiency of vapor deposition materials, and also possible to increase vapor deposition rate and obtain high throughput.

[Recap]

A vapor deposition source in accordance with Aspect 1 of the present invention has a surface which has a plurality of openings via which vapor deposition particles are ejected, the vapor deposition source being configured to have a first length in a first direction and a second length in a second direction which is orthogonal to the first direction, the first length being longer than the second length, the first direction and the second direction being in a same plane, the plurality of openings each having a slit shape defined by (i) two first sides which face each other and (ii) two second sides which face each other, the two first sides being parallel to the first direction and being equal in length, the two second sides being parallel to the second direction and being equal in length, the plurality of openings being arranged, at regular intervals, linearly along the first direction, the two first sides each being not less than 4 times and not more than 50 times as long as each of the two second sides, the two second sides each having a length of not less than 1 mm and not greater than 5 mm, the plurality of openings each having a depth in a third direction that is orthogonal to the first direction and the second direction, the depth being not less than 5 mm and not greater than 20 mm.

According to the above arrangement, in regard to each of the plurality of openings, each of the first sides is not less than 4 times and not more than 50 times as long as each of the second sides, the second sides each have a length of not less than 1 mm and not greater than 5 mm, and the depth in the third direction that is orthogonal to the first direction and the second direction is not less than 5 mm and not greater than 20 mm. That is, each of the plurality of openings has a specific slit shape that brings about a sufficient anisotropic effect in the first direction from the openings and in the second direction from the openings. Furthermore, each of the plurality of openings is provided in the vapor deposition source in a manner such that its longer sides extend along the first direction Therefore, the openings make it possible to control a scattering range of the vapor deposition particles to become wide in the first direction and narrow in the second direction. This makes it possible to provide a vapor deposition source that can achieve uniform film thickness distribution and also achieve high use efficiency of vapor deposition materials.

A vapor deposition source in accordance with Aspect 2 of the present invention is preferably the vapor deposition source in accordance with Aspect 1 arranged such that each of the two first sides is not less than 10 times as long as each of the two second sides.

The above arrangement makes it possible to obtain a stronger anisotropic effect in the first direction from the openings and in the second direction from the openings.

A vapor deposition source in accordance with Aspect 3 of the present invention is preferably the vapor deposition source in accordance with Aspect 1 or 2 arranged such that each of the two first sides is not more than 30 times as long as each of the two second sides.

The above arrangement makes it possible to prevent a significant change in vapor deposition distribution profile caused by a fluctuation in vapor deposition rate or in temperature distribution in the vapor deposition source.

A vapor deposition source in accordance with Aspect 4 of the present invention is preferably the vapor deposition source in accordance with any of Aspects 1 to 3 arranged such that the number of the plurality of openings is not less than 5.

According to the above arrangement, the scattering range of the vapor deposition particles in the first direction is wide.

Therefore, it is possible to obtain a film thickness distribution that is uniform in the first direction.

A vapor deposition source in accordance with Aspect 5 of the present invention is preferably the vapor deposition source in accordance with any of Aspects 1 to 4 arranged such that the sum of one of the regular intervals and a length of one of the two first sides is not less than 1.5 times as long as the length of the one of the two first sides and is not more than 0.2 times as long as a length of the vapor deposition source in the first direction.

The above arrangement makes it possible to obtain a film thickness distribution that is uniform in the first direction.

A vapor deposition source in accordance with Aspect 6 of the present invention may be the vapor deposition source in accordance with any of Aspects 1 to 5 arranged such that the plurality of openings are arranged linearly in a plurality of rows each extending in the first direction and are arranged at regular intervals.

The above arrangement makes it possible to form all the plurality of openings in the surface of the vapor deposition source even in a case where the openings are large in size.

A vapor deposition source in accordance with Aspect 7 of the present invention is preferably the vapor deposition source in accordance with Aspect 6 arranged such that adjacent openings, arranged in the second direction, are offset from each other along the first direction.

The above arrangement makes it possible to prevent or reduce a deterioration of uniformity of the film thickness.

A vapor deposition source in accordance with Aspect 8 of the present invention is preferably the vapor deposition source in accordance with Aspect 7 arranged such that an area between (i) one of the adjacent openings arranged in the second direction and (ii) an opening, adjacent, in the first direction, to the one of the adjacent openings has a center which is in a same position in the first direction as a center, in the first direction, of the other of the adjacent openings arranged in the second direction.

The above arrangement makes it possible to prevent or reduce a deterioration of uniformity of the film thickness.

A vapor deposition device in accordance with Aspect 9 of the present invention includes the vapor deposition source of any of Aspects 1 to 8.

According to the above arrangement, since the vapor deposition device includes the vapor deposition source, it is possible to achieve uniform film thickness distribution and also achieve high use efficiency of vapor deposition materials.

A vapor deposition device in accordance with Aspect 10 is preferably the vapor deposition device in accordance with Aspect 9 arranged such that the vapor deposition particles, ejected from the vapor deposition source, are deposited on a substrate, and a distance, between the surface of the vapor deposition source and the substrate, is reduced as the sum of one of the regular intervals and a length of one of the two first sides is reduced.

The above arrangement makes it possible to obtain uniform film thickness distribution, achieve high use efficiency of vapor deposition materials, and also reduce the size of the vapor deposition device.

A method of forming a vapor-deposited film in accordance with Aspect 11 of the present invention is preferably a method of forming a vapor-deposited film on a substrate with use of the vapor deposition source of any one of Aspects 1 to 8, the method preferably including the step of: carrying out a vapor deposition while moving, in the second direction, at least one of the substrate and the vapor deposition source.

The above method makes it possible to achieve uniform thickness distribution in a film formed on the substrate and also achieve high use efficiency of vapor deposition materials.

A method of forming a vapor-deposited film in accordance with Aspect 12 of the present invention is preferably the method in accordance with Aspect 11 arranged such that a distance, between the surface of the vapor deposition source and the substrate, is reduced as the sum of one of the regular intervals and a length of one of the two first sides is reduced.

The above method makes it possible to achieve a uniform thickness distribution in a film formed on the substrate and also achieve high use efficiency of vapor deposition materials.

[Note]

The present invention is not limited to the embodiments, but can be altered by a skilled person in the art within the scope of the claims. The present invention also encompasses, in its technical scope, any embodiment derived by combining technical means disclosed in differing embodiments. Furthermore, technical means disclosed in differing embodiments may be combined to provide a new technical feature.

INDUSTRIAL APPLICABILITY

The present invention can be used in vapor deposition sources, vapor deposition devices, and methods for forming a vapor-deposited film.

REFERENCE SIGNS LIST

1 Slit nozzle (Opening)
1a Slit nozzle (Opening)
1b Slit nozzle (Opening)
1b' Slit nozzle (Opening)
10 Line source (Vapor deposition source)
10a Line source (Vapor deposition source)
10b Line source (Vapor deposition source)
10U Vapor deposition source having only one slit nozzle
11 Top plate
11a Top plate
11b Top plate
20 Substrate
21 Vapor-deposited film
30 Vapor deposition device
30a Vapor deposition device
W Width of slit nozzle (Length of second side)
L Length of slit nozzle (Length of first side)
A First side
B Second side

The invention claimed is:

1. A vapor deposition source having a surface which has a plurality of openings via which vapor deposition particles are ejected, the vapor deposition source being configured to have a first length in a first direction and a second length in a second direction which is orthogonal to the first direction, the first length being longer than the second length, the first direction and the second direction being in a same plane, the plurality of openings each having a slit shape defined by (i) two first sides which face each other and (ii) two second sides which face each other, the two first sides being parallel to the first direction and being equal in length, the two second sides being parallel to the second direction and being equal in length, the plurality of openings being arranged, at regular intervals, linearly along the first direction, the two first sides each being not less than 4 times and not more than 50 times as long as each of the two second sides, the two second sides each having a length of not less than 1 mm and not greater than 5 mm, the plurality of openings each having a depth in a third direction that is orthogonal to the first direction and the second direction, the depth being not less than 5 mm and not greater than 20 mm.

2. The vapor deposition source according to claim 1, wherein each of the two first sides is not less than 10 times as long as each of the two second sides.

3. The vapor deposition source according to claim 1, wherein each of the two first sides is not more than 30 times as long as each of the two second sides.

4. The vapor deposition source according to claim 1, wherein the number of the plurality of openings is not less than 5.

5. The vapor deposition source according to claim 1, wherein the sum of one of the regular intervals and a length of one of the two first sides is not less than 1.5 times as long as the length of the one of the two first sides and is not more than 0.2 times as long as a length of the vapor deposition source in the first direction.

6. The vapor deposition source according to claim 1, wherein the plurality of openings are arranged linearly in a plurality of rows each extending in the first direction and are arranged at regular intervals.

7. The vapor deposition source according to claim 6, wherein adjacent openings, arranged in the second direction, are offset from each other along the first direction.

8. The vapor deposition source according to claim 7, wherein an area between (i) one of the adjacent openings arranged in the second direction and (ii) an opening, adjacent, in the first direction, to the one of the adjacent openings has a center which is in a same position in the first direction as a center, in the first direction, of the other of the adjacent openings arranged in the second direction.

9. A vapor deposition device comprising a vapor deposition source recited in claim 1.

10. The vapor deposition device according to claim 9, wherein the vapor deposition particles, ejected from the vapor deposition source, are deposited on a substrate, and a distance, between the surface of the vapor deposition source and the substrate, is reduced as the sum of one of the regular intervals and a length of one of the two first sides is reduced.

11. A method of forming a vapor-deposited film on a substrate with use of a vapor deposition source recited in claim 1, said method comprising the step of:

carrying out a vapor deposition while moving, along the second direction, at least one of the substrate and the vapor deposition source.

12. The method according to claim 11, wherein a distance, between the surface of the vapor deposition source and the substrate, is reduced as the sum of one of the regular intervals and a length of one of the two first sides is reduced.

* * * * *